United States Patent
Humphrey et al.

(10) Patent No.: US 10,406,568 B2
(45) Date of Patent: *Sep. 10, 2019

(54) WORKING SURFACE CLEANING SYSTEM AND METHOD

(71) Applicant: INTERNATIONAL TEST SOLUTIONS, INC., Reno, NV (US)

(72) Inventors: Alan Humphrey, Reno, NV (US); Jerry Broz, Longmont, CO (US); James H. Duvall, Reno, NV (US)

(73) Assignee: International Test Solutions, Inc., Reno, NV (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/290,789

(22) Filed: Mar. 1, 2019

(65) Prior Publication Data
US 2019/0201944 A1    Jul. 4, 2019

Related U.S. Application Data

(60) Continuation of application No. 15/818,386, filed on Nov. 20, 2017, now Pat. No. 10,239,099, which is a
(Continued)

(51) Int. Cl.
*B08B 7/00* (2006.01)
*B08B 1/00* (2006.01)
*G01R 3/00* (2006.01)

(52) U.S. Cl.
CPC ............ *B08B 7/0028* (2013.01); *B08B 1/007* (2013.01); *G01R 3/00* (2013.01)

(58) Field of Classification Search
CPC .......... B08B 7/0028; B08B 1/007; G01R 3/00
See application file for complete search history.

(56) References Cited

U.S. PATENT DOCUMENTS

| 2,971,208 A | 2/1961 | Moore et al. |
| 3,453,677 A | 7/1969 | Cutler |

(Continued)

FOREIGN PATENT DOCUMENTS

| CN | 1717285 | 1/2006 |
| DE | 20-2004-009619 | 10/2004 |

(Continued)

OTHER PUBLICATIONS

International Test Solutions, Probe Clean™ on Silicon Wafer Publication, dated May 2002 (2 pgs.).
(Continued)

*Primary Examiner* — Sharidan Carrillo
(74) *Attorney, Agent, or Firm* — DLA Piper LLP (US)

(57) ABSTRACT

A cleaning film designed to remove foreign matter and particulates from working surfaces of cleaning wafers used in semiconductor processes. These processes include wafer sort test for cleaning of probe card pins and FEOL tooling for cleaning during wafer handling equipment and wafer chucks. The debris collected on the cleaning wafer working surfaces is removed by the particle removal film allowing the debris and foreign matter to be discarded. The use of the cleaning film allows the operator to refresh the cleaning wafer without use of an outside vendor and eliminates wet washing and the use of solvents in the cleaning process.

8 Claims, 4 Drawing Sheets

Related U.S. Application Data division of application No. 13/961,127, filed on Aug. 7, 2013, now Pat. No. 9,833,818, which is a continuation-in-part of application No. 13/912,840, filed on Jun. 7, 2013, now abandoned, which is a continuation of application No. 11/237,596, filed on Sep. 27, 2005, now abandoned.

(60) Provisional application No. 60/614,073, filed on Sep. 28, 2004.

(56) References Cited

U.S. PATENT DOCUMENTS

| | | |
|---|---|---|
| 3,675,265 A | 7/1972 | Landen et al. |
| 4,104,755 A | 8/1978 | Smith |
| 4,334,780 A | 6/1982 | Pernick |
| 4,590,422 A | 5/1986 | Milligan |
| 5,011,513 A | 4/1991 | Zador et al. |
| 5,192,455 A | 3/1993 | Marcel |
| 5,205,460 A | 4/1993 | Sato et al. |
| 5,220,279 A | 6/1993 | Nagasawa |
| 5,444,265 A | 8/1995 | Hamilton |
| 5,485,949 A | 1/1996 | Tamura et al. |
| 5,652,428 A | 7/1997 | Nishioka et al. |
| 5,685,043 A | 11/1997 | LaManna et al. |
| 5,690,749 A * | 11/1997 | Lee ............ B08B 7/0028 134/26 |
| 5,778,485 A | 7/1998 | Sano et al. |
| 5,783,018 A | 7/1998 | Gore et al. |
| 5,814,158 A | 9/1998 | Hollander et al. |
| 5,968,282 A | 10/1999 | Yamasaka |
| 6,019,663 A * | 2/2000 | Angell ............ B24B 19/16 451/5 |
| 6,056,627 A | 5/2000 | Mizuta |
| 6,118,290 A | 9/2000 | Sugiyama et al. |
| 6,121,058 A | 9/2000 | Shell et al. |
| 6,130,104 A | 10/2000 | Yamasaka |
| 6,170,116 B1 | 1/2001 | Mizuta |
| 6,183,677 B1 | 2/2001 | Usui et al. |
| 6,193,587 B1 | 2/2001 | Lin et al. |
| 6,224,470 B1 | 5/2001 | Hoey et al. |
| 6,280,298 B1 | 8/2001 | Gonzales |
| 6,306,187 B1 | 10/2001 | Maeda et al. |
| 6,322,433 B1 | 11/2001 | Matsumura |
| 6,326,413 B1 | 12/2001 | Blackwell et al. |
| 6,355,495 B1 | 3/2002 | Fujino et al. |
| 6,366,112 B1 | 4/2002 | Doherty et al. |
| 6,474,350 B1 | 11/2002 | Mizuta |
| 6,646,455 B2 | 11/2003 | Maekawa et al. |
| 6,733,876 B1 | 5/2004 | Beardsley et al. |
| 6,741,086 B2 | 5/2004 | Maekawa et al. |
| 6,776,171 B2 * | 8/2004 | Carpenter ............ B08B 7/0014 134/1 |
| 6,777,966 B1 | 8/2004 | Humphrey et al. |
| 6,884,300 B2 | 4/2005 | Sato et al. |
| 6,888,344 B2 | 5/2005 | Maekawa et al. |
| 6,960,123 B2 | 11/2005 | Mitarai |
| 7,202,683 B2 | 4/2007 | Humphrey et al. |
| 7,254,861 B2 | 8/2007 | Morioka et al. |
| 7,306,849 B2 | 12/2007 | Buckholtz et al. |
| 7,530,887 B2 | 5/2009 | Jiang et al. |
| 7,621,436 B2 | 11/2009 | Mii |
| 7,866,530 B1 | 1/2011 | Riachentsev |
| 7,975,901 B2 | 7/2011 | Maeda et al. |
| 8,371,316 B2 | 2/2013 | Humphrey et al. |
| 8,790,466 B2 | 7/2014 | Broz et al. |
| 8,801,869 B2 | 8/2014 | Broz et al. |
| 8,876,983 B2 | 11/2014 | Widhalm |
| 9,093,481 B2 * | 7/2015 | Levinson .......... H01L 21/67028 |
| 9,318,362 B2 | 4/2016 | Leung et al. |
| 9,833,818 B2 | 12/2017 | Humphrey et al. |
| 10,195,648 B2 | 2/2019 | Broz et al. |
| 2001/0007421 A1 | 7/2001 | Marcuse et al. |
| 2002/0028641 A1 | 3/2002 | Okubo et al. |
| 2002/0079349 A1 | 6/2002 | Macover |
| 2002/0096187 A1 | 7/2002 | Kuwata et al. |
| 2002/0097060 A1 | 7/2002 | Maekawa et al. |
| 2003/0027496 A1 | 2/2003 | Back et al. |
| 2003/0076490 A1 | 4/2003 | Clark |
| 2003/0092365 A1 | 5/2003 | Grube |
| 2003/0138644 A1 | 7/2003 | Khandros et al. |
| 2003/0200989 A1 | 10/2003 | Humphrey et al. |
| 2004/0083568 A1 | 5/2004 | Morioka et al. |
| 2004/0096643 A1 | 5/2004 | Sato et al. |
| 2004/0200515 A1 | 10/2004 | Saito et al. |
| 2005/0001645 A1 | 1/2005 | Humphrey et al. |
| 2005/0026552 A1 | 2/2005 | Fawcett et al. |
| 2005/0034743 A1 | 2/2005 | Kim et al. |
| 2005/0126590 A1 | 6/2005 | Sato et al. |
| 2005/0255796 A1 | 11/2005 | Haga |
| 2006/0065290 A1 | 3/2006 | Broz et al. |
| 2006/0076337 A1 | 4/2006 | Brunner et al. |
| 2006/0151004 A1 | 7/2006 | Terada et al. |
| 2006/0219754 A1 | 10/2006 | Clauberg et al. |
| 2006/0289605 A1 | 12/2006 | Park et al. |
| 2007/0178814 A1 | 8/2007 | Sato et al. |
| 2007/0284419 A1 | 12/2007 | Matlack et al. |
| 2008/0023028 A1 | 1/2008 | Fujita |
| 2008/0070481 A1 | 3/2008 | Tamura et al. |
| 2008/0242576 A1 | 10/2008 | Tamura et al. |
| 2009/0212807 A1 | 8/2009 | Chen et al. |
| 2010/0132736 A1 | 6/2010 | Lin et al. |
| 2010/0258144 A1 | 10/2010 | Broz et al. |
| 2010/0294435 A1 | 11/2010 | Maeda et al. |
| 2011/0132396 A1 * | 6/2011 | Humphrey ............ B08B 1/00 134/6 |
| 2012/0048298 A1 | 3/2012 | Humphrey et al. |
| 2013/0056025 A1 | 3/2013 | Widhalm |
| 2014/0338698 A1 | 11/2014 | Humphrey et al. |
| 2015/0187617 A1 | 7/2015 | Leung et al. |
| 2018/0017748 A1 | 1/2018 | Mir Shafiei |
| 2018/0071798 A1 | 3/2018 | Humphrey et al. |

FOREIGN PATENT DOCUMENTS

| | | |
|---|---|---|
| DE | 10-2005-052308 | 5/2007 |
| JP | 2005/8131743 | 8/1983 |
| JP | 63-204728 | 8/1988 |
| JP | 2005/211195 | 8/1993 |
| JP | H07244074 | 9/1995 |
| JP | 2011/145212 | 5/1999 |
| JP | 2000/232125 | 8/2000 |
| JP | 2000/332069 | 11/2000 |
| JP | 2005/326250 | 11/2005 |
| JP | 2006/013185 | 1/2006 |
| JP | 2006/165395 | 6/2006 |
| JP | 2006/186133 | 7/2006 |
| JP | 2008/070280 | 3/2008 |
| JP | 2008/147551 | 6/2008 |
| JP | 2008/270270 | 11/2008 |
| JP | 2011/117938 | 6/2011 |
| JP | 2004/840118 | 12/2011 |
| JP | 2014/107561 | 6/2014 |
| KR | 10-2003-92730 | 7/2003 |
| KR | 10-2008-89297 | 3/2009 |
| KR | 10-2011-063275 | 6/2011 |
| TW | 409322 | 10/2000 |
| WO | 98/47663 | 10/1998 |

OTHER PUBLICATIONS

International Test Solutions Publication, Probe Clean™ for Use on Prober Abrasion Plates, dated May 2002 (2 pgs.).

International Test Solutions Publication, Probe Clean™ Non-Abrasive Method to Clean Loose Debris from Probe Tips, dated May 2002 (1 pg.).

International Test Solutions Publication, Probe Polish™ on Silicon Wafer, dated May 2002 (2 pgs.).

International Test Solutions Publication, Probe Polish™ for Use on Prober Abrasion Plates, dated May 2002 (2 pgs.).

(56) References Cited

OTHER PUBLICATIONS

International Test Solutions Publication, Probe Scrub™ Restore Probe Tip Performance and Remove Bonded Debris, dated May 2002 (1 pg.).
International Test Solutions, Probe Form™ Publication, dated Jul. 7, 2005 (2 pgs.).
International Test Solutions, Cleaning Parameters for TEL Probers P8 and P8-XL Publication, dated printout dated Sep. 18, 2003 http://web.archive.org/web/20030918014522/http://inttest.net/products/PC2002.pdf (3 pgs.).
Anonymous: "Wire Bonding"—Wikipedia—Retrieved from the Internet https://en.wikipedia.org/wiki/Wire_bonding\ (2 pgs).
Neware, Pallawi, B., et al, "Flexible Organic Light Emitting Diodes—FOLED," Oct. 26, 2015, vol. 5, No. 5, pp. 3457-3462.
Zhao, L., et al., "Novel Method for Fabricating Flexible Active Matrix Organiz Light Emitting Diode (AMOLED) Displays," Sep. 21, 2011, (5 pp.).

* cited by examiner

WORKING SURFACE CLEANING SYSTEM AND METHOD

PRIORITY CLAIMS/RELATED APPLICATIONS

This application is a continuation of and claims priority under 35 USC 120 to U.S. patent application Ser. No. 15/818,386 filed Nov. 20, 2017 now U.S. Pat. No. 10,239,099, which in turn is a divisional of and claims priority under 35 USC §§ 120 and 121 to U.S. patent application Ser. No. 13/961,127 filed Aug. 7, 2013 and entitled "Working Surface Cleaning System And Method" (issued as U.S. Pat. No. 9,833,818 on Dec. 5, 2017) which in turn is a continuation in part of and claims priority under 35 USC § 120 to U.S. patent application Ser. No. 13/912,840 filed Jun. 7, 2013 and titled "Working Surface Cleaning System And Method", now abandoned, which is in turn a continuation of and claims priority under 35 USC § 120 to U.S. patent application Ser. No. 11/237,596 filed on Sep. 27, 2005 and entitled "Cleaning Method" which in turn claims the benefit under 35 USC § 119(e) to U.S. Provisional Patent Application Ser. No. 60/614,073 filed of Sep. 28, 2004, the entirety of all of which are incorporated herein by reference.

FIELD

The disclosure relates generally to a material, device, and method for removing particles and other foreign matter from the working surface of a cleaning device which is used during semiconductor manufacturing and testing.

BACKGROUND

It is desirable to be able to clean the working surface of devices that are used for probe card cleaning and semiconductor hardware cleaning wafers which are used to remove debris from wafer handling equipment (such as robot arms and end effectors) and wafer stages (such as a wafer chuck, wafer tables and/or pre-align chucks). The foreign matter and particulates collected on the probe card cleaning and hardware cleaning wafers are removed by the particle removal device that allows the surface debris that has been collected and removed from a probe card or the wafer handling hardware to be collected and discarded.

It is desirable to provide a cleaning method that allows the use of the particle removal device to refresh the working surface without the use of an outside vendor or the use of a wet washing step as part of the cleaning process.

Thus, it is desirable to provide such as cleaning method and system and it is to this end that the disclosure is directed.

DETAILED DESCRIPTION OF ONE OR MORE EMBODIMENTS

Figure 1:
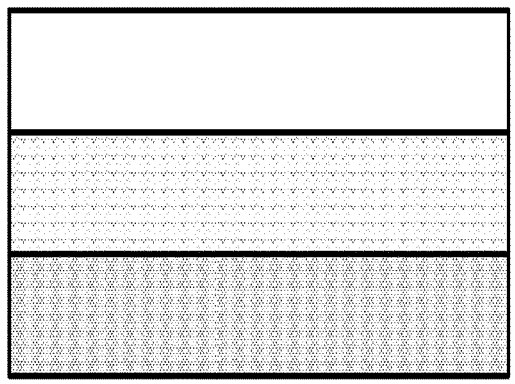
FIG. 1 is a perspective view of a cleaning film polymer with protective liner and film backing.

The disclosure is directed to a device, material, and method designed to non-destructively and non-invasively remove foreign matter and particulates from the working surfaces of cleaning devices that are used for probe card cleaning during semiconductor device testing. The cleaning device and method can also be used to remove foreign matter and particulates from the working surfaces of cleaning devices and wafers used for cleaning wafer handling hardware and wafer stages in front end of line (FEOL) equipment during semiconductor device manufacturing.

The probe card cleaning materials as described in prior art can consist of unfilled and particulate filled elastomers to provide abrasive properties for debris removal and surface tack properties to collect the dislodged debris.

Debris is removed from the wafer test probe pins through contact with probe card cleaning materials. After repeated use of the probe card cleaning material, dislodged debris accumulates on the cleaning device working surface reducing contact with the probes to be cleaned and therefore diminishing the effectiveness of the material. The prior method for removing the accumulated debris consisted of a wet washing process to remove foreign matter and particulates from the cleaning material working surface with a solvent such as isopropyl alcohol.

The particle removal device and method extends to cleaning and debris collection from the cleaning wafers that are used in other front end of line (FEOL) processes such as stepper, photolithography, PVD, CVD and Etch tools. In the case of cleaning devices and wafers that are used to remove foreign matter and particulates from wafer handling hardware and wafer chucks in front end of line (FEOL) semiconductor device manufacturing tools, debris during the cleaning process will accumulate on the working surface of the cleaning device or wafer. Once particles and contaminants are collected and removed from the FEOL semiconductor manufacturing tool by the cleaning wafer it should not be recycled through the FEOL tool without a surface cleaning due to the risk of the collected debris re-entering the tool. For example, the FEOL cleaning wafer is used to remove particulate causing de-focus spots in lithography tools and as the particle is removed from the tool the chance of the particle causing a de-focus re-occurrence is eliminated. The particle must not re-enter the tool on the cleaning wafer. The particle removal device is used to lift the debris from the FEOL cleaning wafer surface and after usage, the particle removal device is subsequently discarded. Similar to probe cleaning wafers, the prior method for removing the accumulated debris consisted of wet washing the cleaning material surface with a solvent such as isopropyl alcohol.

The disclosure is directed to a non-destructive, solvent free method of effectively removing collected debris on the cleaning material surface. The device and method effectively extends the lifetime of the cleaning material surface while retaining the surface tack and abrasive properties required for proper cleaning of probe card pins and wafer chucks.

Referring now to the device in more detail, in FIG. 1 there is shown a cleaning polymer, or particle removal film, 10 affixed to a plastic film backing composed of one or more intermediate layers 30 and protected by contact with a release surface coated liner film 20. In FIG. 1, the plastic film backing 20 is made of one or more intermediate layers of polyethylene terephthalate (PET) or other material that allows application of the cleaning polymer during manufacturing and also allows flexing or bending during application to and removal from the cleaning material surface. The removable protective layer 20 that is installed prior to the intended usage for contact element cleaning in order to isolate the surface cleaning pad layer from non-test related contaminants. The removable protective layer 20 protects the working surface of the cleaning pad layer 202 from debris/contaminants until the cleaning device is ready to be used for cleaning a tester interface in a clean room. When the cleaning device is ready to be used for cleaning a tester interface in a clean room, the removable protective layer 20 may be removed to expose the working surface of the cleaning pad layer 10. The protective layer may be made of a known non-reactive polymeric film material and preferably made of a polyester (PET) film. The protective layer may have a matte finish or other "textured" features to improve the optical detection of the cleaning device by the testing equipment and/or improve cleaning efficiency.

Additional intermediate materials layers with predetermined properties can be used for the plastic film backing to support the cleaning polymer layer, or particle removal layer. The cleaning polymer layer 10 is comprised of an elastic polymer, such as acrylic polymer, a butadiene elastomer, a styrene copolymer elastomer, a silicone elastomer or other polymer with adhesive properties, with a controlled surface tack, or surface adhesion, and does not transfer materials. The elastic, adhesive polymer is formed on the surface of the plastic backing to produce a continuous, flexible, flat film. The polymer material is preferably an acrylic elastomer but may be silicone, rubber based or any other elastic polymer that can be formed with a surface tack property between 8.0 and 50.0 psi. The elastic polymer material is processed to be durable under repeated handling without a reduction in surface tack or surface adhesion. The material should be sufficiently processed and/or cross-linked such that transference from the particle removal film to the cleaning material surface does not occur. The thickness of the particle removal polymer layer is preferably 0.0005 inches to 0.010 inches. The thickness of the polymer is sufficient to allow the material to deform around the particulate on the cleaning material surface to collect debris that has accumulated during contact of the probe card pins on the cleaning material surface. A protective release film layer or liner 30 is shown which will consist of a plastic film such as polyethylene terephthalate (PET) or similar plastic material where a low surface energy coating such as silicone or fluoro silicone has been applied to allow easy removal of the protective liner from the cleaning polymer layer without transfer of material.

The one or more intermediate layers 30 (that may also be one to N compliant support layers) may be attached to and below the cleaning pad layer 10. The combinations of layers in the one or more intermediate layers 30 produce material properties unavailable from the individual constituent materials, while the wide variety of matrix, abrasive particles, and geometries allows for a product or structure that has to choose an optimum combination to maximize cleaning performance. By adding compliant or microporous foam underlayers beneath a rigid cleaning layer, the overall abrasive wear characteristics of the cleaning material are reduced and/or the tip shaping performance are enhanced in order to extend the overall service life of the probe element without compromising the shape or function of the contact geometry. For example, application of the abrasive particle layer onto a rigid polyester film creates a lapping film type cleaning material with stock removal characteristics used to create and maintain a probe contact elements with flat contact area geometries. Application of the same abrasive particle layer to the surface of a compliant unfilled polymer or the "skin" side of a microporous foam, results in multi-layered material with preferential stock removal characteristics for creating and maintaining a probe contact element with a radius or semi-radius contact area geometry. As the overall compliance of the underlayer(s) is systematically increased (or rigidity is decreased), the overall abrasive wear characteristics of the cleaning material transition from creating and maintaining a flat tip contact area geometry to creating and maintaining a radius or semi-radius contact area geometry.

The one or more intermediate layers (which can be compliant as described above, rigid as described below or a combination of compliant and rigid layers as described below) may provide predetermined mechanical, material, and dimensional characteristics to the cleaning material. For example, the one or more intermediate layers may provide abrasiveness (described in more detail below), a specific gravity (of a range of 0.75 to 2.27 for example) wherein specific gravity is the ratio of the density of the one or more intermediate layers to the density of water at a particular temperature, elasticity (of a range of 40-MPa to 600-MPa for example), tackiness (of a range of 20 to 800 grams for example), planarity, thickness (a range between 25-um and 300-um for example), and/or a hardness between 30 Shore A and 90 Shore A.

Figure 2:
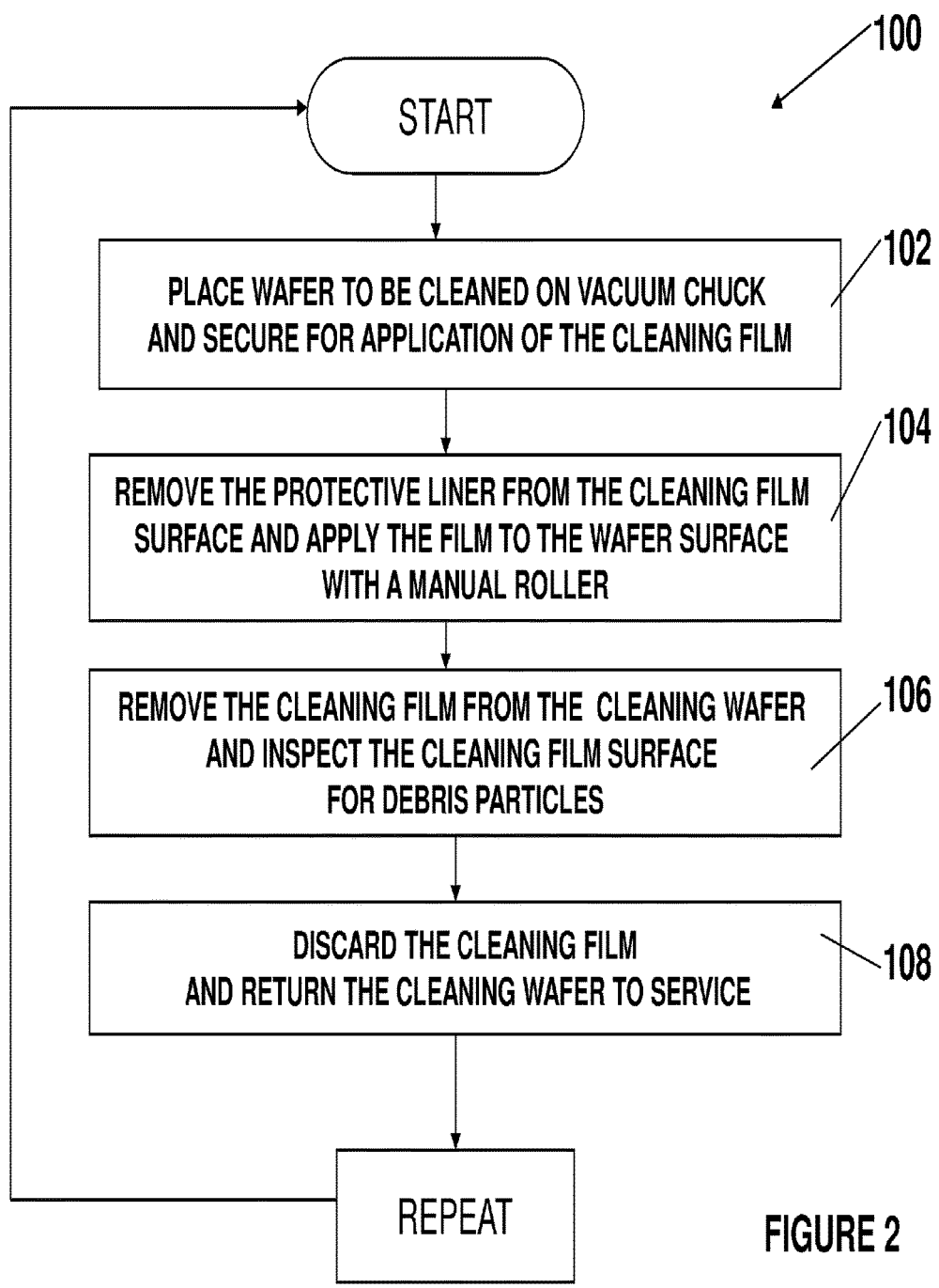
FIG. 2 is a flow chart showing process steps for the cleaning film as used in on-probe cleaning wafers or chuck cleaning wafers.

Referring to FIG. 2, a flow chart is shown outlining a method 100 to use the particle removal film to remove debris from a used probe cleaning wafer or chuck cleaning wafer. In FIG. 2, a probe card cleaning wafer or a FEOL tool cleaning wafer that was used to remove debris is taken out of service (i.e. removed from the prober or lithography tool) and placed on a vacuum chuck to secure the wafer in place (102). The particle removal film protective liner is removed (104) and, preferably concurrently, the particle removal film layer is laminated to the working surface of the cleaning wafer. The debris or foreign matter that has been collected on the cleaning wafer working surface through normal processing now is preferentially adhered to the cleaning film surface. Particulate debris and foreign matter gets attached to the particle removal film surface due to the greater magnitude of surface tack and adhesion force of the particle removal polymer materials. The surface tack and adhesion properties of the particle removal film surface are predetermined to range from 40 to 1600 grams such that they exceed the surface tack and adhesion properties of the cleaning polymer, which can range from 20 to 800 grams, for example. The tack or surface adhesion level of the particle removal film surface is up to 50 psi or greater than that of the cleaning polymer and, therefore, substantially greater than that of the working surface of the cleaning polymer. As shown in FIG. 2, the cleaning film also may be applied to the wafer surface with a manual roller.

Figure 3A:
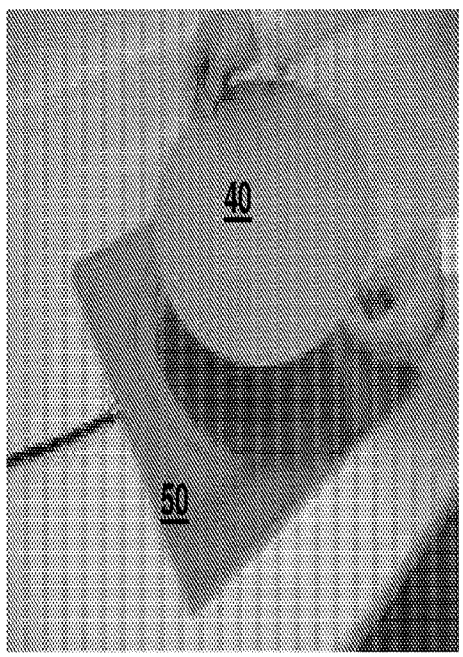
FIGS. 3A-3D are photographic representations of the application and removal of the cleaning film.
Figure 3B:
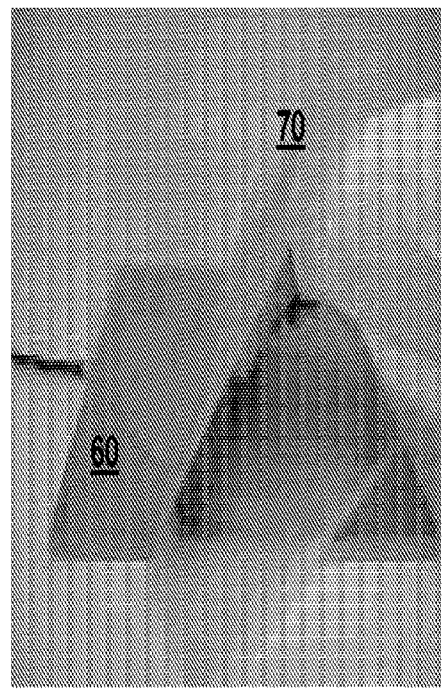
Figure 3C:
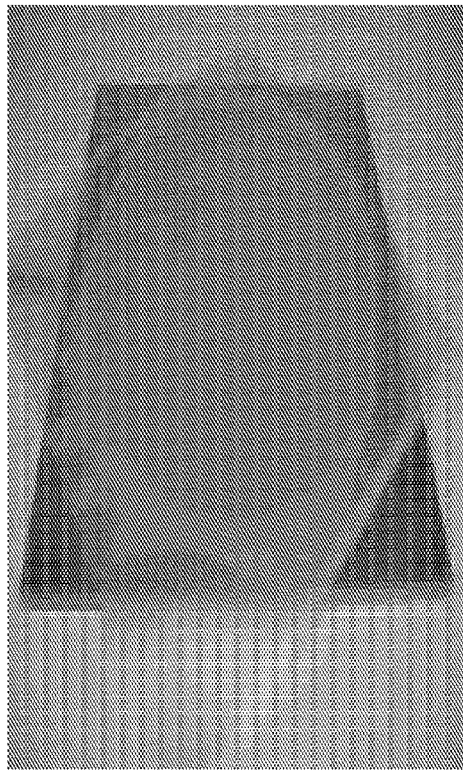
Figure 3D:
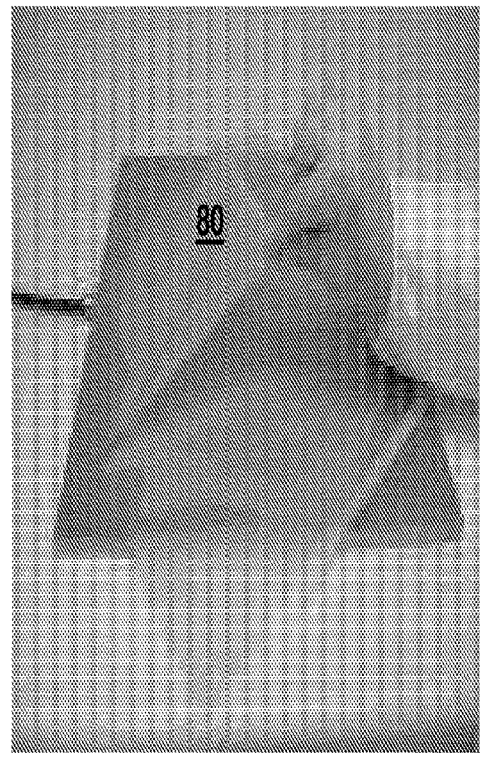

FIGS. 3A-3D show photographic representations of the use of the particle removal film to clean the surface of a cleaning wafer typically used for probe card cleaning or for debris removal from FEOL tools. In FIG. 3A, the cleaning wafer 40 is placed on a vacuum chuck 50 to secure the wafer for application of the particle removal film. A protective liner of the removal film shown in FIG. 1 is removed 60 as the particle removal film polymer 70 is applied to the working surface of the cleaning wafer as shown in FIG. 3B. Debris from the working surface preferentially adheres to the particle removal film once full contact is achieved with the wafer surface as shown in FIG. 3C. As the cleaning film is removed 80 as shown in FIG. 3D, the debris is lifted from the cleaning wafer surface and discarded with the film.

Upon removal of the cleaning film, the trapped particulate debris and foreign matter is lifted from the cleaning wafer surface (106) and properly discarded along with the cleaning film (108). In one case, the removal of the cleaning film from the cleaning wafer surface is facilitated by the difference in surface energy level as the surface energy of the cleaning wafer is approximately 10 to 30 dyne/cm and the cleaning film polymer surface energy is approximately 40 to 60 dyne/cm. This difference prohibits adhesion and physical contact (i.e. surface wetting) between the materials and allows easy manual removal of the particle removal film. After removal of the particles from the working surface, the particle removal film is discarded along with the collected debris and foreign matter. The working surface of the cleaning wafer is now free of loose debris and can be returned to service cleaning probe card pins or semiconductor fabrication process chucks.

In one embodiment, the device cleans the working surface of a semiconductor process cleaning wafer (i.e. probe card cleaning or lithography wafer chuck cleaning). The device collects debris and foreign matter that has accumulated on the working surface of the cleaning wafer during normal usage. The debris preferentially adheres to the cleaning device allowing removal and discard. The device allows cleaning and refreshing of the cleaning wafer working surface without requiring the shipment of the wafer for refurbishing at an outside vendor. The device also eliminates the use of wet washing and the use of solvents from the wafer cleaning process.

In the method, a piece of semiconductor processing equipment (such as the probe card device or FEOL devices described above) may use a cleaning wafer the clean the piece of semiconductor processing equipment, such as the probes of a probe card. Following a plurality of cleanings, when the cleaning wafer has debris on it, the cleaning wafer is removed from the piece of semiconductor processing equipment and then cleaned as described above. Once the cleaning wafer is cleaned using the cleaning film, the cleaning wafer is returned to service in the piece of semiconductor processing equipment to be used to clean the piece of semiconductor processing equipment.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, methods, and examples, but by all embodiments and methods within the scope and spirit of the invention as claimed.

The invention claimed is:

1. A method for cleaning a cleaning wafer, the method comprising:

securing a cleaning wafer having a working surface that has debris embedded in a top surface of the working surface from cleaning of one of a probe card machine and a front end of line (FEOL) device, said top surface of the working surface having a surface energy level of 10 to 30 dyne/cm; and removing debris from the top surface of the cleaning wafer by applying a cleaning film having a surface energy level of 40 to 60 dyne/cm to the top surface of the working surface of the cleaning wafer, wherein a difference in the surface energy level between the cleaning film and the working surface of the cleaning wafer causes the debris to release from the top surface of the working surface of the cleaning wafer onto the cleaning film without using a solvent.

2. The method of claim 1, wherein securing the cleaning wafer further comprises placing the cleaning wafer on a vacuum chuck.

3. The method of claim 1, wherein applying the cleaning film further comprises removing a protective liner that covers the cleaning film before applying the cleaning film to the top surface of the working surface of the cleaning wafer.

4. The method of claim 1, wherein applying the cleaning film further comprises using a manual roller to apply the cleaning film to the top surface of the working surface of the cleaning wafer.

5. The method of claim 1 further comprising discarding the cleaning film with the embedded debris.

6. The method of claim 5 further comprising returning the cleaning wafer to service after it has been cleaned using the cleaning film.

7. The method of claim 6, wherein returning the cleaning wafer to service further comprises installing the cleaning wafer back into the front end of line (FEOL) device.

8. The method of claim 5, wherein returning the cleaning wafer to service further comprises installing the cleaning wafer back into the probe card machine.

* * * * *